(12) United States Patent
Liu et al.

(10) Patent No.: US 11,398,388 B2
(45) Date of Patent: Jul. 26, 2022

(54) METHODS FOR SELECTIVE DRY ETCHING GALLIUM OXIDE

(71) Applicant: Applied Materials, Inc., Santa Clara, CA (US)

(72) Inventors: Feng Q. Liu, San Jose, CA (US); Lisa J. Enman, Sunnyvale, CA (US); Lakmal C. Kalutarage, San Jose, CA (US); Mark J. Saly, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/014,251

(22) Filed: Sep. 8, 2020

(65) Prior Publication Data

US 2022/0076960 A1    Mar. 10, 2022

(51) Int. Cl.
*H01L 21/311* (2006.01)
*H01L 21/02* (2006.01)

(52) U.S. Cl.
CPC ......... *H01L 21/31122* (2013.01); *H01L 21/02175* (2013.01)

(58) Field of Classification Search
CPC ......... H01L 21/31122; H01L 21/02175; H01L 21/311; H01L 21/31105; H01L 21/31138
USPC ............. 438/706, 710, 712, 714, 720, 722
See application file for complete search history.

(56) References Cited

U.S. PATENT DOCUMENTS

2018/0223437 A1* 8/2018 George ............... C09K 13/08

FOREIGN PATENT DOCUMENTS

| CN | 107993934 A | 5/2018 |
|---|---|---|
| JP | 2020-113637 A | 7/2020 |
| KR | 2018-0120370 A | 11/2018 |
| WO | 2019-190453 A1 | 10/2019 |

OTHER PUBLICATIONS

George et al. (Thermal Atomic Layer Etching of Gallium Oxide Using Sequential Exposures of HF and Various Metal Precursors. Chem. Mater. 2020, 32, 5937-5948, Jun. 19, 2020) (Year: 2020).*
International Search Report and Written Opinion dated Dec. 21, 2021 in International Patent Application No. PCT/US2021/047641, 9 pages.
Lee, et al., Thermal Atomic Layer Etching of Gallium Oxide Using Sequential Exposures of HF and Various Metal Precursors, Chemistry of Materials 2020 32 (14), 5937-5948, DOI: 10.1021/acs.chemmater.0c00131.

* cited by examiner

*Primary Examiner* — Lan Vinh
(74) *Attorney, Agent, or Firm* — Kilpatrick Townsend & Stockton LLP

(57) ABSTRACT

Exemplary methods of etching gallium oxide from a semiconductor substrate may include selectively etching gallium oxide relative to gallium nitride. The method may include flowing a reagent in a substrate processing region housing the semiconductor substrate. The reagent may include at least one of chloride and bromide. The method may further include contacting an exposed region of gallium oxide with the at least one of chloride and bromide from the reagent to form a gallium-containing gas. The gallium-containing gas may be removed by purging the substrate processing region with an inert gas. The method includes recessing a surface of the gallium oxide. The method may include repeated cycles to achieve a desired depth.

13 Claims, 5 Drawing Sheets

METHODS FOR SELECTIVE DRY ETCHING GALLIUM OXIDE

TECHNICAL FIELD

The present technology relates to semiconductor processes and equipment. More specifically, the present technology relates to dry etching material relative to other material.

BACKGROUND

Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Dry etch processes are often desirable for selectively removing material from semiconductor substrates. The desirability stems from the ability to gently remove material from miniature structures with minimal physical disturbance. Dry etch processes also allow the etch rate to be abruptly stopped by removing the gas phase reagents. Some dry-etch processes involve the exposure of a substrate to remote plasma by-products formed from one or more precursors. However, dry-etch processes are still needed, which delicately remove oxides having limited or no previously known chemically volatile pathways or that are plasma free.

Thus, there is a need for improved systems and methods that can be used to minimize surface defects and improve quantum efficiency and performance of components. These and other needs are addressed by the present technology.

SUMMARY

Exemplary methods of etching a gallium oxide material may include flowing one or more reagents to contact an exposed region of gallium oxide. The methods may include dry etching. The methods may include selectively etching gallium oxide relative to gallium nitride. Advantageously, the substrate processing region may be plasma free.

Some embodiments of the present technology may include a method for etching gallium oxide from a semiconductor substrate. The method may include flowing a reagent in a substrate processing region housing the semiconductor substrate. The reagent may include at least one of chloride and bromide. The semiconductor substrate may be or include an exposed region of gallium oxide. The method may include contacting the exposed region of gallium oxide with the at least one of chloride and bromide from the reagent to form a gallium-containing gas. The method may include purging the substrate processing region with an inert gas to remove the gallium-containing gas. The method may include recessing a surface of the gallium oxide.

In some embodiments, the method may be repeated for at least two cycles to achieve a desired etch depth. The method may further include halting the flow of the chloride-containing reagent or the bromide-containing reagent after a first period of time. The method may further include purging the substrate processing region with the inert gas for a second period of time. The processing region may be maintained plasma free. The reagent may include at least one of titanium tetrachloride, titanium tetrabromide, silicon tetrachloride, silicon tetrabromide, vanadium(V) chloride, niobium pentachloride, tantalum pentachloride, tungsten(V) chloride, molybdenum(V) chloride, zirconium tetrachloride, molybdenum oxytetrachloride, tungsten(VI) oxytetrachloride, or combinations thereof. In some embodiments, the reagent may be titanium tetrachloride. The exposed region of gallium oxide may be or may include overlying gallium nitride. The method may demonstrate an etching selectivity between gallium oxide and gallium nitride that is greater than or about 10:1. The temperature in the processing region may be maintained between about 150° C. and about 650° C. The pressure in the processing region may be maintained at less than or about 250 Torr.

Some embodiments of the present technology may include another method for etching gallium oxide from a semiconductor substrate. The method may include flowing a first reagent in a substrate processing region housing the semiconductor substrate. The first reagent may include HX or MeX, wherein X is at least one of fluorine, chlorine, and bromine. The semiconductor substrate may be or include an exposed region of gallium oxide. The method may include fluorinating the exposed region of gallium oxide to activate the surface to form a gallium halide and $H_2O$. The method may include flowing a second reagent in the substrate processing region. The second reagent may be at least one of trimethyaluminum, trimethylgallium, aluminum chloride, tin tetrachloride, tin acetylacetonate, tetramethylsilane, trimethyltin chloride, and boron tribromide. The second reagent may promote a ligand exchange wherein a methyl group is transferred to the gallium halide to form a volatile $Me_2GaY$ or $Me_3Y$, wherein Y is the at least one of fluorine, chlorine, and bromine. The method may include recessing a surface of the gallium oxide.

In some embodiments, the method may include the at least one of flowing the first reagent and flowing the second reagent includes pulsing for about 3 seconds. The method may include subsequent to the at least one of flowing the first reagent and flowing the second reagent includes purging the substrate processing region with an inert gas. The method may include subsequent to the flowing the first reagent, the substrate processing region may be purged with an inert gas to remove the $H_2O$. The inert gas may include He or Ar. In some embodiments, the method may further include flowing a third reagent in the substrate processing region. The third reagent may be at least one of chlorine, bromine, boron trichloride, and boron tribromide. The method may include being repeated for at least two cycles to achieve a desired etch depth. The method may demonstrate an etching rate of from about 0.1 Å to about 6 Å per cycle. The processing region may be maintained plasma free. The exposed region of gallium oxide may be or may include overlying gallium nitride. The method may demonstrate an etching selectivity between gallium oxide and gallium nitride that is greater than or about 10:1.

Such technology may provide numerous benefits over conventional systems and techniques. For example, the methods may selectivity etch gallium oxide within semiconductor structures. Additionally, the methods may protect underlying gallium nitride and/or provide gallium nitride that may be free of surface defects. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
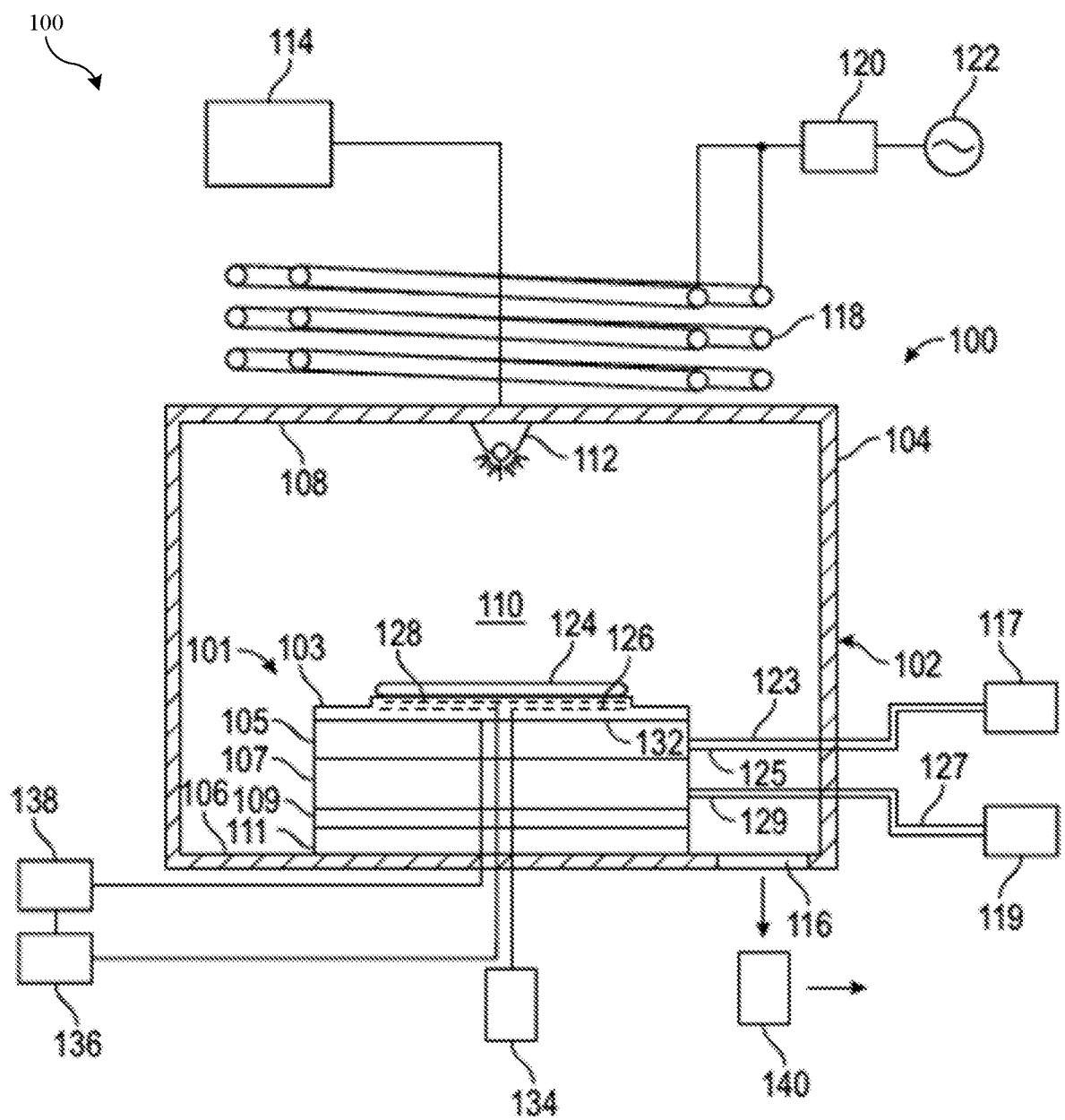
FIG. 1 shows a schematic cross-sectional view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Micro-LED displays possess potential advantages such as high contrast, fast response, and relatively wide color gamut, low power consumption, and long lifetime. The prospects of a wide range of applications of micro-LEDs have attracted a large number of manufacturers, startups, and academic researchers to establish programs in the field. However, new technical challenges arise with shrinking chip size coupled with expanded chip density. Key challenges arise from epitaxy and micro-chip processes. Reduction in the size of micro-LEDs and spacing between devices can cause problems in chip processing and deteriorate LED performance.

Gallium oxide, with a wide bandgap of 4.8 eV capable of operating at much higher temperatures and powers than conventional small-bandgap silicon-based chips, has received attention as an exciting candidate for the active layer of future semiconducting devices. As such, gallium oxide is currently being developed for optical devices, such as transparent epitaxial layer on gallium nitride (GaN)-based LEDs. One important problem is the degradation of the quantum efficiency and homogeneity due to a sidewall effect, which may be caused by a high density of surface defects formed during device processing, leading to degraded electrical injection in the p-GaN. Defects at structure edges may be related to gallium oxide formed onto the GaN, where the gallium oxide then needs to be removed resulting in pitting on the surface of the GaN. Acting as non-radiative centers, the surface defects significantly degrade the internal quantum efficiency of the micro-LEDs. In an example, a decrease in maximum external quantum efficiency (EQE) from ~10% to ~5% with reduction in chip size from above 500 µm×500 µm to 10 µm×10 µm has been reported for micro-LEDs.

Known methods for etching gallium oxide include wet etching, reactive-ion etching (REI), inductively coupled plasma (ICP), and activated Cl etching with $Cl_2$, $BCl_3$, $SF_6$, and the like. However, these methods are disadvantageous as they provide less selectivity of gallium oxide relative to gallium nitride thus leading to defects on gallium nitride.

Many conventional technologies utilize a wet etch or a plasma etch for etching gallium oxide. However, these methods include disadvantages such as having less selectivity of gallium oxide relative to gallium nitride thus leading to defects on gallium nitride. While wet etching may be more robust than other etching techniques, the wet etching may etch the placeholder or substrate materials further than necessary or desired. For example, the wet etching may over etch some features. Using wet etchants may also create the need for subsequent operations to remove residues formed within the trenches or holes. Plasma etching techniques also are disadvantageous in that exposure to plasma effluents may damage the surface of underlying materials.

The present technology overcomes these issues by performing a dry etch process to etch gallium oxide. This may include selectively etching gallium oxide relative to gallium nitride without damaging the gallium nitride surface. By using particular reagents or reagent combinations/sequences in a plasma free processing region environment, exposed surfaces of gallium nitride may be undamaged during the etch process to remove gallium oxide. In this way, the etching operations to be performed may not remove or may only minimally remove underlying structure materials, such as gallium nitride.

Although the remaining disclosure will routinely identify specific etching processes utilizing the disclosed technology, it will be readily understood that the systems and methods are equally applicable to a variety of other deposition and cleaning processes as may occur in the described chambers. Accordingly, the technology should not be considered to be so limited as for use with the described treatment and cleaning processes alone. Moreover, although an exemplary chamber is described to provide foundation for the present technology, it is to be understood that the present technology can be applied to virtually any semiconductor processing chamber that may allow the single-chamber operations described.

FIG. 1 illustrates a cross-sectional schematic view of an exemplary plasma processing chamber 100, shown configured as an etch chamber, having a substrate support assembly 101. The substrate support assembly 101 may be utilized in other types of plasma processing chambers, for example plasma treatment chambers, annealing chambers, physical vapor deposition chambers, chemical vapor deposition chambers, and ion implantation chambers, among others, as well as other systems that may uniformly maintain a surface or substrate, such as a substrate 124, at a particular temperature. In some embodiments chamber 100 may be configured for cryogenic processing, although any other processing conditions may similarly be encompassed. Reactive ion etching a substrate maintained at a cryogenic temperature may improve anisotropic aspects of the etch process as explained above, for example.

The plasma processing chamber 100 may include a chamber body 102 having sidewalls 104, a base 106, and a lid 108 that may enclose a processing region 110. An injection apparatus 112 may be coupled with the sidewalls 104 and/or lid 108 of the chamber body 102. A gas panel 114 may be fluidly coupled with the injection apparatus 112 to allow process gases to be provided into the processing region 110. The injection apparatus 112 may be one or more nozzle or inlet ports, or alternatively a showerhead. Process gases, along with any processing by-products, may be removed from the processing region 110 through an exhaust port 116 formed in the sidewalls 104 or base 106 of the chamber body 102. The exhaust port 116 may be coupled with a pumping system 140, which may include throttle valves, pumps, or other materials utilized to control the vacuum levels within the processing region 110.

The process gases may be energized to form a plasma within the processing region 110. For example, the process gases may be energized by capacitively or inductively coupling RF power to the process gases. In the embodiment depicted in the figure, a plurality of coils 118 for inductively coupled plasma generation may be disposed above the lid 108 of the plasma processing chamber 100 and may be coupled through a matching circuit 120 to an RF power source 122. In some embodiments, the processing region 110 is maintained plasma free.

The substrate support assembly 101 may be disposed in the processing region 110 below the injection apparatus 112. The substrate support assembly 101 may include an electrostatic chuck 103 and a base assembly 105. The base assembly may be coupled with the electrostatic chuck 103 and a facility plate 107. The facility plate 107 may be supported by a ground plate 111, and may be configured to facilitate electrical, cooling, heating, and gas connections with the substrate support assembly 101. The ground plate 111 may be supported by the base 106 of the processing chamber, although in some embodiments the assembly may couple with a shaft that may be vertically translatable within the processing region of the chamber. An insulator plate 109 may insulate the facility plate 107 from the ground plate 111, and may provide thermal and/or electrical insulation between the components.

The base assembly 105 may include or define a refrigerant channel coupled with a fluid delivery system 117. In some embodiments, fluid delivery system 117 may be a cryogenic chiller, although the present technology is not limited to cryogenic applications as will be explained further below. The fluid delivery system 117 may be in fluid communication with the refrigerant channel via a refrigerant inlet conduit 123 connected to an inlet of the refrigerant channel and via a refrigerant outlet conduit 125 connected to an outlet of the refrigerant channel such that the base assembly 105 may be maintained at a predetermined temperature, such as a first temperature. In some embodiments, the fluid delivery system 117 may be coupled with an interface box to control a flow rate of the refrigerant. The refrigerant may include a material that can maintain any temperature, including a cryogenic temperature, that may be below or about 0° C., below or about −50° C., below or about −80° C., below or about −100° C., below or about −125° C., below or about −150° C., or lower.

Again, it is to be understood that other substrate supports encompassed by the present technology may be configured to operate at a variety of other processing temperatures as well, including above or about 0° C., greater than or about 100° C., greater than or about 250° C., greater than or about 400° C., or greater. The fluid delivery system 117 may provide the refrigerant, which may be circulated through the refrigerant channel of the base assembly 105. The refrigerant flowing through the refrigerant channel may enable the base assembly 105 to be maintained at the processing temperature, which may assist in controlling the lateral temperature profile of the electrostatic chuck 103 so that a substrate 124 disposed on the electrostatic chuck 103 may be uniformly maintained at a cryogenic processing temperature.

The facility plate 107 may include or define a coolant channel coupled with a chiller 119. The chiller 119 may be in fluid communication with the coolant channel via a coolant inlet conduit 127 connected to an inlet of the coolant channel and via a coolant outlet conduit 129 connected to an outlet of the coolant channel such that the facility plate 107 may be maintained at a second temperature, which in some embodiments may be greater than the first temperature. In some embodiments, a single, common chiller may be used for fluid delivery to both the base assembly and the facility plate. Consequently, in some embodiments fluid delivery system 117 and chiller 119 may be a single chiller or fluid delivery system. In some embodiments, the chiller 119 may be coupled with an interface box to control a flow rate of the coolant. The coolant may include a material that can maintain temperatures greater than or about 0° C., and may maintain temperatures greater than or about 20° C., greater than or about 30° C., greater than or about 40° C., greater than or about 50° C., or greater. In some embodiments, alternative heating mechanisms may be employed including resistive heaters, which may be distributed in the facility plate, the electrostatic chuck, or the base assembly. In some embodiments the facility plate may not include heating components. The chiller 119 may provide the coolant, which may be circulated through the coolant channel of the facility plate 107. The coolant flowing through the coolant channel may enable the facility plate 107 to be maintained at a predetermined temperature, which may assist in maintaining the insulator plate 109 at a temperature above the first temperature, for example.

The electrostatic chuck 103 may include a support surface on which a substrate 124 may be disposed, and may also include a bottom surface 132 opposite the support surface. In some embodiments, the electrostatic chuck 103 may be or include a ceramic material, such as aluminum oxide, aluminum nitride, or other suitable materials. Additionally, the electrostatic chuck 103 may be or include a polymer, such as polyimide, polyetheretherketone, polyaryletherketone, or any other polymer which may operate as an electrostatic chuck within the processing chamber.

The electrostatic chuck 103 may include a chucking electrode 126 incorporated within the chuck body. The chucking electrode 126 may be configured as a monopole or bipolar electrode, or any other suitable arrangement for electrostatically clamping a substrate. The chucking electrode 126 may be coupled through an RF filter to a chucking power source 134, which may provide a DC power to electrostatically secure the substrate 124 to the support surface of the electrostatic chuck 103. The RF filter may prevent RF power utilized to form a plasma within the plasma processing chamber 100 from damaging electrical equipment or presenting an electrical hazard outside the chamber. In some embodiments, the processing region 110 is maintained plasma free.

The electrostatic chuck 103 may include one or more resistive heaters 128 incorporated within the chuck body. The resistive heaters 128 may be utilized to elevate the temperature of the electrostatic chuck 103 to a processing temperature suitable for processing a substrate 124 disposed on the support surface. The resistive heaters 128 may be coupled through the facility plate 107 to a heater power source 136. The heater power source 136 may provide power, which may be several hundred watts or more, to the resistive heaters 128. The heater power source 136 may include a controller utilized to control the operation of the heater power source 136, which may generally be set to heat the substrate 124 to a predetermined processing temperature. In some embodiments, the resistive heaters 128 may include a plurality of laterally separated heating zones, and the controller may enable at least one zone of the resistive heaters 128 to be preferentially heated relative to the resistive heaters 128 located in one or more of the other zones. For example, the resistive heaters 128 may be arranged concentrically in a plurality of separated heating zones. The resistive heaters 128 may maintain the substrate 124 at a processing temperature suitable for processing.

The substrate support assembly 101 may include one or more probes disposed therein. In some embodiments, one or more low temperature optical probe assemblies may be coupled with a probe controller 138. Temperature probes may be disposed in the electrostatic chuck 103 to determine the temperature of various regions of the electrostatic chuck 103. In some embodiments, each probe may correspond to a zone of the plurality of laterally separated heating zones of the resistive heaters 128. The probes may measure the temperature of each zone of the electrostatic chuck 103. The probe controller 138 may be coupled with the heater power source 136 so that each zone of the resistive heaters 128 may be independently heated. This may allow the lateral temperature profile of the electrostatic chuck 103 to be maintained substantially uniform based on temperature measurements, which may allow a substrate 124 disposed on the electrostatic chuck 103 to be uniformly maintained at the processing temperature.

Figure 2:
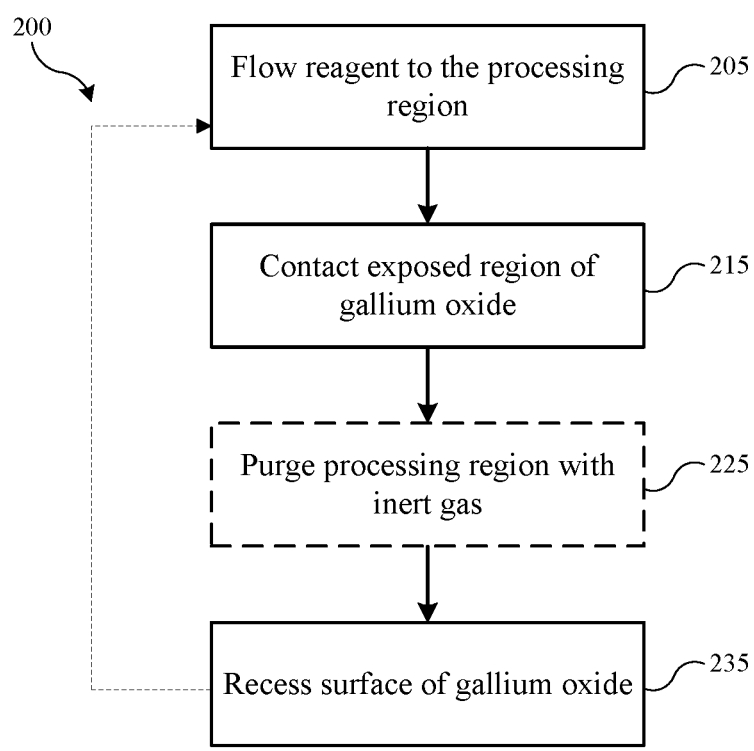
FIG. 2 shows exemplary operations in a method according to embodiments of the present technology.

The chambers discussed previously may be used in performing exemplary methods including selective etching methods. Turning to FIG. 2 is shown exemplary operations in a method 200 according to some embodiments of the present technology. Prior to the first operation of the method, a substrate may be processed in one or more ways before being placed within a processing region of a chamber in which method 200 may be performed. For example, features may be produced, and vias or trenches may be formed or defined within the substrate. The vias or trenches may have an aspect ratio, or a ratio of their height to width, greater than or about 2, greater than or about 5, greater than or about 10, greater than or about 20, greater than or about 30, greater than or about 50, or more in embodiments. Although the remaining disclosure will discuss gallium oxide and gallium nitride, any other known materials used in these two layers may be substituted for one or more of the layers. Some or all of these operations may be performed in chambers or system tools as previously described, or may be performed in different chambers on the same system tool, which may include the chamber in which the operations of methods described herein are performed.

The method 200 may include flowing a reagent in a substrate processing region housing the semiconductor substrate. The reagent may include at least one of chloride and bromide. The semiconductor substrate may include an exposed region of gallium oxide. An exemplary chamber may be chamber 100 previously described. The reagent may be flowed to a processing region of the chamber at operation 205. In some embodiments, the reagent may interact with the substrate in the processing region based on thermal activation, and in some embodiments no plasma activation may occur. The substrate may include any number of layers of material including oxides, nitrides, or any other materials. In some embodiments a layer of gallium oxide may be formed overlying a layer of gallium nitride, and one or both layers may be exposed.

The etching process to remove gallium oxide may have relatively high selectivity to gallium nitride, such as selectivities greater than or about 10:1 or more. However, in some structures, the amount of gallium oxide to be removed may be several nanometers up to a fraction of a micrometer or more. For example, in some embodiments the amount of gallium oxide to be recessed may be tens of nanometers up to hundreds of nanometers. Such an amount of material to be etched may occur over a relatively longer etching time period or over repeated cycles. The selectivity to gallium nitride of the oxide removal process may operate in part based on an oxide affinity to the reagent, creating volatile materials that will remove the gallium oxide material. Contacting an exposed region of gallium oxide with at least one of chlorine and bromine from the reagent may form a gallium-containing gas at operation 215, along with a removal of oxygen into the reagent donating the chlorine or bromine. This process may include a purge cycle at operation 225 in which the volatiles are released to provide for more etch control.

The gallium-containing gas formed is highly volatile and may be removed from the processing region by purging the processing region with an inert gas at operation 225. Any exposed surfaces of gallium nitride may not be affected, or may be minimally affected by the gallium-containing gas, while the gallium oxide may be etched isotropically. Additionally, by utilizing particular chloride-containing or bromide-containing reagents, etching of the gallium oxide may be achieved and controlled to an etch thickness of less than or about 30 Å per cycle, and may be controlled to less than or about 20 Å per cycle, less than or about 10 Å per cycle, less than or about 5 Å per cycle, less than or about 1 Å per cycle, less than or about 0.5 Å per cycle, less than or about 0.1 Å per cycle, or less. In some embodiments, the cycle is repeated for at least two cycles to achieve a desired etch depth.

The etching process may be continued for a first period of time in some embodiments. Subsequent the first period of time, the flow of the chloride-containing reagent or the bromide-containing reagent may be halted. The extent of the interaction of the reagent with the gallium oxide at operation 215 may be controlled by halting the flow of the chloride-containing reagent or the bromide-containing reagent at operation 205 after the first period of time.

The extent of the interaction of the reagent with the gallium oxide may further be controlled by optionally purging the substrate processing region with the inert gas for a second period of time. The optional purge may be performed at operation 225, which may remove residual etchant materials, etch byproducts, or other materials from the chamber in addition to the removal of the gallium-containing gas formed upon operation 215. The purge may be performed with any number of materials that may be chemically inert, such as nitrogen or noble gases such as helium and/or argon, which may be used to purge the processing region of the chamber. The purging process may improve etch selectivity by expediting removal of byproducts as well as the volatile chloride-containing reagent or the bromide-containing reagent, and reduce the residence time of these materials within the processing region. This may facilitate the isotropic etching of the gallium oxide while reducing exposure and impact on gallium nitride, for example.

The first period of time may be sufficient to produce etching of gallium oxide, while limiting residence time that may begin to affect nitride surfaces. For example, in some embodiments the first period of time may be greater than or about 5 seconds, and may be greater than or about 10 seconds, greater than or about 15 seconds, greater than or about 20 seconds, greater than or about 25 seconds, greater than or about 30 seconds, greater than or about 35 seconds, greater than or about 40 seconds, greater than or about 45 seconds, greater than or about 50 seconds, greater than or about 55 seconds, greater than or about 60 seconds, greater than or about 2 minutes, or longer. However, to limit additional effects, in some embodiments the first period of time may be less than or about 5 minutes, less than or about 4 minutes, less than or about 3 minutes, less than or about 2 minutes, or less.

The second period of time related to optional purging may be sufficient to halt etching of gallium oxide. For example, in some embodiments the second period of time may be greater than or about 5 seconds, and may be greater than or about 10 seconds, greater than or about 15 seconds, greater than or about 20 seconds, greater than or about 25 seconds, greater than or about 30 seconds, or longer. Additionally, any or all operations may be maintained plasma free. In some embodiments, only thermal etching reagents were used to etch gallium oxide. Chloride-containing reagents or the bromide-containing reagents used in the present technology may include at least one of titanium tetrachloride ($TiCl_4$), titanium tetrabromide ($TiBr_4$), silicon tetrachloride ($SiCl_4$), silicon tetrabromide ($SiBr_4$), vanadium(V) chloride ($VCl_5$), niobium pentachloride ($NbCl_5$), antalum pentachloride ($TaCl_5$), tungsten(V) chloride ($WCl_5$), molybdenum(V) chloride ($MoCl_5$), zirconium tetrachloride ($ZrCl_4$), molybdenum oxytetrachloride ($MoOCl_4$), tungsten(VI) oxytetrachloride ($WOCl_4$), or combinations thereof. An exemplary chloride-containing reagent may be titanium tetrachloride, which may be flowed into the processing region. Other sources of chloride or bromide may be used in conjunction with or as replacements for the titanium tetrachloride.

A flow rate of the chloride-containing reagents or the bromide-containing reagents may be maintained between at least about 1 sccm and about 100 sccm in some embodiments. Without being bound by any particular theory, it is believed that the chloride-containing reagent acts to transfer the chloride, or bromide for a bromine-containing reagent, to the gallium of the etch target gallium oxide. Likewise the chloride-containing reagent acts to receive the oxygen of the etch target gallium oxide. For example, employing titanium tetrachloride as the chloride-containing reagent in the method 200, the chloride of titanium tetrachloride is transferred to the gallium of gallium oxide, and the oxygen of gallium oxide is transferred to the titanium chloride structure. In this example, the mechanism reaction may be driven by the strong bonding energy between Ti and O and by the high volatility of the gallium chloride gas that is formed at operation 215. Based upon the bonding energies of the components, such as bonding energies among Ti—Cl, Ti—O, Ti—N, Ga—O, and Ga—N, a high selectivity of etching gallium oxide may be achieved relative to gallium nitride, which may have less favorable bonding or transfer. Method 200 is a thermal process that is mild as compared with a process including radical chlorine such as with plasma processes, for example, and thus advantageously leads to less damage to the surface of the underlying gallium nitride. For example, the plasma enhanced chlorine may more readily interact with gallium nitride, while the thermally transferred chlorine may more readily displace oxygen.

Process conditions may also impact the operations performed in method 200. Each of the operations of method 200 may be performed during a constant temperature in embodiments, while in some embodiments the temperature may be adjusted during different operations. For example, the substrate, pedestal, or chamber temperature during the oxide etching may be maintained at a temperature greater than or about 150° C., and in some embodiments the temperature may be maintained greater than or about 200° C., greater than or about 250° C., greater than or about 300° C., greater than or about 350° C., greater than or about 400° C., greater than or about 450° C., greater than or about 500° C., greater than or about 550° C., greater than or about 600° C., greater than or about 650° C., or higher. However, at higher temperatures, further dissociation of the chloride-containing reagents or the bromide-containing reagents may occur, which may produce further etching. As the amount of etchant increases, nitride may begin to etch more readily. Accordingly, in some embodiments the temperature may be maintained below or about 700° C., and may be maintained below or about 650° C., below or about 600° C., below or about 550° C., below or about 500° C., or less. In some embodiments, the temperature in the processing region according to method 200 is maintained between about 150° C. and about 650° C.

In some embodiments, the process may occur at a variety of pressures, which may facilitate operations in any of a number of process chambers. For example, the process may be performed within chambers capable of providing pressures below or about 10 mTorr, or lower, such as with a turbomolecular pump. Additionally, the pressure within the chamber may be maintained at higher pressures, which may increase the associated etch rate, and the pressure within the processing chamber may be maintained at greater than or about 1 Torr, and may be maintained at greater than or about 2 Torr, greater than or about 5 Torr, greater than or about 10 Torr, greater than or about 50 Torr, greater than or about 100 Torr, greater than or about 200 Torr, or higher.

By performing an amount of etch followed by an amount of purge, a controlled isotropic etch of gallium oxide may be performed. To further facilitate etching, the present technology may be performed in a number of cycles to refresh the gallium nitride, which may be underlying the gallium oxide, and which may allow the removal of etch byproducts, and facilitate delivery of etchants into the lateral recesses of the gallium oxide. In some embodiments the process, including the optional purge, may be performed in greater than or about 2, greater than or about 3, greater than or about 4, greater than or about 5, greater than or about 10 cycles, greater than or about 20 cycles, greater than or about 50 cycles, greater than or about 100 cycles, greater than or about 200 cycles, or more cycles, depending on factors such as the extent of gallium oxide etching to be performed, or other effects of the process.

A benefit of performing additional cycles may include to mitigate the effect that the gallium nitride may eventually react to the process for removing gallium oxide after an incubation period or contact period in which the chloride-containing reagent or bromide-containing reagent may begin to interact with and extend into the nitride structure. However, although the chloride-containing reagent or bromide-containing reagent may only minimally interact with the gallium nitride, the reagents may contact any exposed surfaces of the layers of gallium nitride. By performing a purge as described above, the reacted gallium halide gas formed by contacting the gallium oxide with the reagent may then be efficiently expelled from the chamber. This may, at least to an extent, refresh the incubation period, and may increase the overall selectivity of the gallium oxide etch process relative to gallium nitride by removing residual etchant from the gallium nitride with each cycle. By performing the processes as described above, an etch selectivity of gallium oxide relative to gallium nitride may be maintained at greater than or about 10:1, and may produce selectivity of greater than or about 15:1, greater than or about 20:1, greater than or about 30:1, greater than or about 50:1, greater than or about 70:1, greater than or about 100:1, greater than or about 200:1, greater than or about 300:1, greater than or about 400:1, greater than or about 500:1, or higher.

Figure 3A:
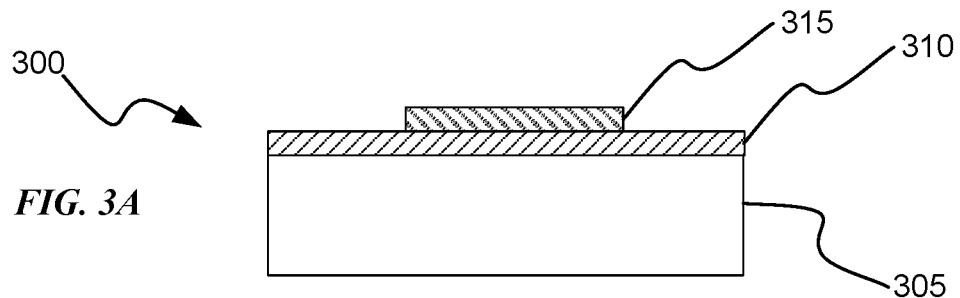
FIGS. 3A-3D show cross-sectional views of substrates being processed according to embodiments of the present technology.

Turning to FIGS. 3A-3D are shown cross-sectional views of structure 300 being processed according to some embodiments of the present technology. The structure may illustrate layers incorporated in a semiconductor structure, which may include any number of layers or exposed materials. For example, the structure may include gallium oxide 315 overlying a substrate 305, which may include an exposed region of gallium nitride 310 as shown in FIG. 3A.

Figure 3B:
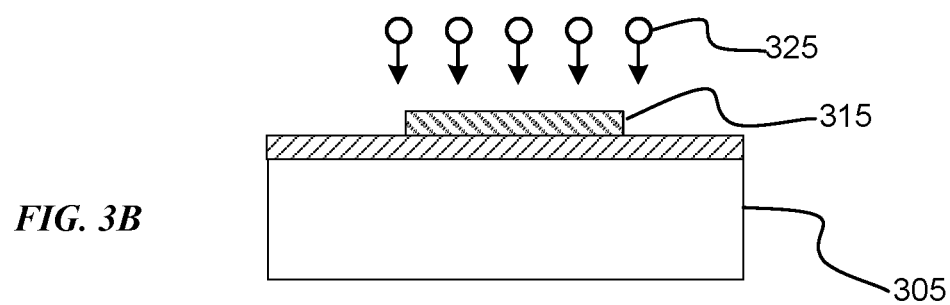
Figure 3C:
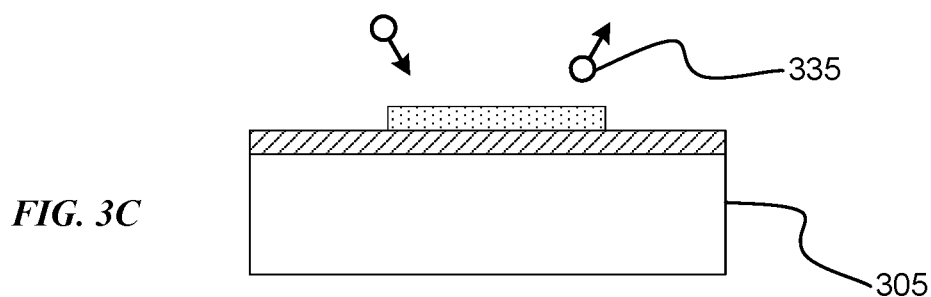

In FIG. 3B is illustrated a structure after methods according to the present technology have begun to be performed, such as discussed with respect to FIG. 2 above. A chloride-containing reagent or bromide-containing reagent 325 is flowed to contact gallium oxide 315. The chloride-containing reagent or bromide-containing reagent may be delivered to the substrate processing region (such as region 110 of FIG. 1), where the reagent may interact with the exposed gallium oxide material 315. As described above, etching gallium oxide according to embodiments of the present technology may provide a transfer mechanism between the reagent and the gallium oxide to form products 335, which may include multiple volatile materials. Products 335 may include a gallium halide gas as well as an oxygen-incorporated metal-containing gas, such as titanium chloride that may have accepted an oxygen atom. The metal-containing etchant may still be a gas, and the substituted metal-containing etchant including oxygen and the volatile gallium halide may all be purged from the chamber.

Figure 3D:
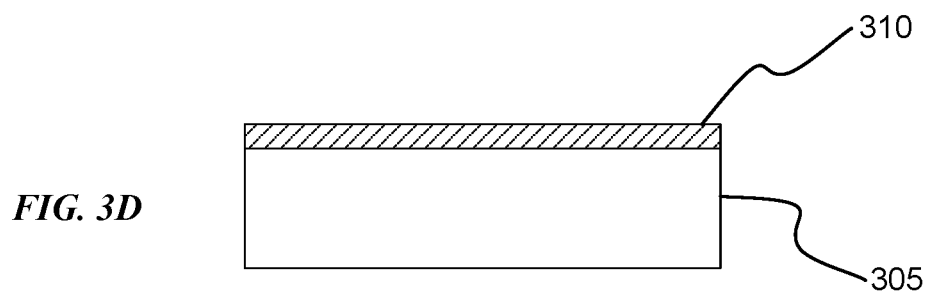

FIG. 3D illustrates a structure after further methods or operations according to the present technology have been performed, such as discussed with respect to FIG. 2 above. For example, as the etch process continues, the processing region is purged and the products 335 are removed to provide a substrate 305 free of gallium oxide 315, while having minimal or no etching of exposed gallium nitride 310. By utilizing reagents as discussed throughout the present technology, gallium oxide may be etched from the substrate or gallium nitride, while limiting the damage or removal of gallium nitride.

Figure 4:
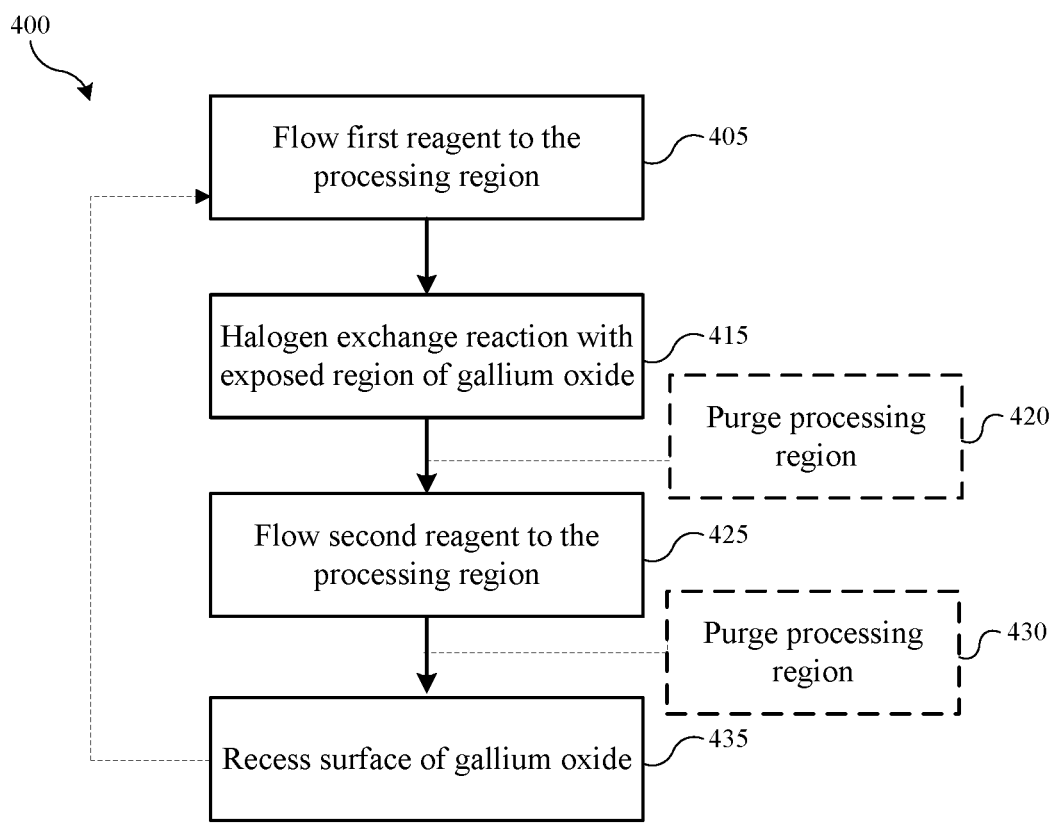
FIG. 4 shows exemplary operations in another method according to embodiments of the present technology.

As discussed above, the chambers discussed previously may be used in performing exemplary methods including selective etching methods. Turning to FIG. 4 is shown exemplary operations in a method 400 according to some embodiments of the present technology. Prior to the first operation of the method, a substrate may be processed in one or more ways before being placed within a processing region of a chamber in which method 400 may be performed similarly as discussed above from method 200. Some or all of these operations may be performed in chambers or system tools as previously described, or may be performed in different chambers on the same system tool, which may include the chamber in which the operations of methods described herein are performed.

The method 400 may include flowing a first reagent in a substrate processing region housing the semiconductor substrate. The first reagent may include HX or MeX, wherein X is at least one of fluorine, chlorine, and bromine, including greater than or about 1, 2, 3, 4, 5, or six coupled fluorine atoms. Exemplary metals for the Me may be or include titanium, niobium, tantalum, molybdenum, tungsten, or sulfur, which may also include a bonded oxygen, such as with thionyl bromide or thionyl chloride. The semiconductor substrate may include an exposed region of gallium oxide. The exposed region of gallium oxide may be incorporated on a substrate with an exposed region of gallium nitride, or may be overlying a region of gallium nitride. An exemplary chamber may be chamber 100 previously described. The first reagent may be flowed to a processing region of the chamber at operation 405. Method 400 may be an atomic layer etch process, which includes sequential, self-limiting surface reactions to remove thin films of gallium oxide bromide-containing with atomic layer control. Method 400 may include a pulsed delivery of the first reagent and/or a pulsed delivery of a second reagent sequentially. In some embodiments, at least one of flowing the first reagent and flowing the second reagent includes pulsing operations that may occur for less than or about 5 seconds, and may occur for less than or about 4 seconds, less than or about 3 seconds, less than or about 2 seconds, or less. Method 400 may provide a fluorination and ligand-exchange reaction. As compared with the method 200, which may include forming a gallium chloride gas, for example, the method 400 may form gallium fluoride that can be on the order of one hundred times less volatile than gallium chloride gas. In some embodiments, the first reagent of method 400 may interact with the substrate in the processing region to produce a fluorinated gallium and water vapor.

The etching method 400 to remove gallium oxide may have relatively high selectivity to gallium nitride, such as selectivities greater than or about 10:1 or more. However, in some structures, the amount of gallium oxide to be removed may be several nanometers up to a fraction of a micrometer or more. For example, in some embodiments the amount of gallium oxide to be recessed may be tens of nanometers up to hundreds of nanometers. Such an amount of material to be etched may occur with pulsed time periods optionally over repeated cycles. The selectivity during the oxide removal process may operate in part based on an oxide affinity to the first reagent, which activates an exposed region of the gallium oxide material to form gallium halide and water ($H_2O$) at operation 415. The etching process may be continued for a first pulsed period of time in some embodiments as noted above, and again the time may be controlled to limit or prevent any reaction with gallium nitride. Subsequent the first pulsed period of time, the first reagent flow may be halted.

The extent of the interaction of the reagent with the gallium oxide at operation 415 may be controlled by pulsing the flow of the first reagent at operation 405 and optionally purging the processing region at operation 420. The extent of the interaction of the first reagent with the gallium oxide may further be controlled by purging the substrate processing region with the inert gas for a second period of time. The purge may be performed with any number of materials that may be chemically inert, such as nitrogen or noble gases such as helium and/or argon, which may be used to purge the processing region of the chamber. Subsequent to flowing the first reagent, purging with an inert gas may act to remove the water.

Subsequent the optional purge, a second reagent may be flowed into the processing region at operation 425. The second reagent may operate to interact with the halogenated gallium to remove the halogenated gallium from residual gallium oxide. The transfer may also be performed thermally as described above at any of the temperature and/or pressure regimes noted previously. In one non-limiting example, trimethylamine may transfer one or more methyl groups to the halogenated gallium, which may produce a methylated byproduct that is volatile and may subsequently be purged from the chamber, such as $(CH_3)_2GaF$. The second reagent may have limited interaction with gallium oxide or gallium nitride, and thus the second interaction may be self-limiting, and may halt upon fully removing the portion of gallium oxide that has been halogenated from the first exposure operation. The second reagent may also be pulsed over any of the time periods as previously described.

Some embodiments optionally include a purge cycle at operation 430 in which the methylated byproduct and residual reagent materials is removed from the chamber. Any exposed surfaces of gallium nitride may not be affected, or may be minimally affected by the first and second reagents, while the gallium oxide may be etched. Because the halide treatment, such as fluorination, may occur only at a surface of the gallium oxide, and the second reagent may have limited interaction beyond the halogenated region and may be self-limiting, improved control over the etch process may be provided as the treatment will self-terminate after converting and removing a top layer of the lattice. Accordingly, etching of the gallium oxide may be controlled to an etch thickness of less than or about 6 Å per cycle, and may be limited to a thickness of less than or about 5 Å per cycle, less than or about 4 Å per cycle, less than or about 3 Å per cycle, less than or about 2 Å per cycle, less than or about 1 Å per cycle, less than or about 0.5 Å per cycle, less than or about 0.2 Å per cycle, or less. In some embodiments, the cycle is repeated for at least two cycles to achieve a desired etch depth, and the process may be repeated for any number of cycles as noted above. Additionally, any or all operations may be maintained plasma free. In some embodiments, only thermal activation may be used to etch gallium oxide.

As discussed above, the first reagent used in the present technology according to method 400 at operation 405 may include HX, wherein X is at least one of fluorine, chlorine, bromine, or combinations thereof. An exemplary first reagent may be hydrofluoric acid (HF), or a metal fluoride as discussed above, which may be flowed into the processing region. Other sources of fluorine, chlorine, or bromine may be used in conjunction with or as replacements for the HF. The second reagent used in the present technology according to method 400 at operation 425 may include trimethylaluminum (TMA), trimethylgallium (TMG, $Ga(CH_3)_3$), aluminum chloride ($AlCl_3$), tin tetrachloride ($SnCl_4$), tin acetylacetonate (Sn(acac), $Sn(CH_3COCHCOCH_3)_2$), tetramethylsilane (TMS, $Si(CH_3)_4$) and any other family member that may substitute one or more methyl moieties with chlorine and/or hydrogen, trimethyltin chloride (($CH_3)_3SnCl$) and any family member that may substitute one or more additional moieties with chlorine, chlorine ($Cl_2$), bromine ($Br_2$), boron trichloride ($BCl_3$), boron tribromide ($BBr_3$), or combinations thereof. Although any of the precursors may be used, precursors containing a methyl group moiety may facilitate formation of a volatile byproduct of the previously halogenated gallium, while having limited or no interaction with gallium nitride. Other second reagents as described may be used in conjunction with or as replacements for the TMA.

By performing an amount of etch followed by an amount of purge, a controlled isotropic etch of gallium oxide may be performed in method 400. To further facilitate etching, the present technology may be performed in a number of cycles to refresh the gallium nitride, which may be underlying the gallium oxide or otherwise exposed on the substrate, to allow the removal of etch byproducts, and facilitate delivery of etchants into the lateral recesses of the gallium oxide. In some embodiments the process, including the optional purge, may be performed in greater than or about 2, greater than or about 3, greater than or about 4, greater than or about 5, greater than or about 10 cycles, greater than or about 20 cycles, greater than or about 50 cycles, greater than or about 100 cycles, greater than or about 200 cycles, or more cycles, depending on factors such as the extent of gallium oxide etching to be performed, or other effects of the process.

A benefit of performing additional cycles may include to mitigate the effect that any underlying gallium nitride may eventually react to the process for removing gallium oxide. By performing the processes as described above, an etch selectivity of gallium oxide relative to gallium nitride may be maintained at greater than or about 10:1, and may produce selectivity of greater than or about 15:1, greater than or about 20:1, greater than or about 30:1, greater than or about 50:1, or higher.

Figure 5A:
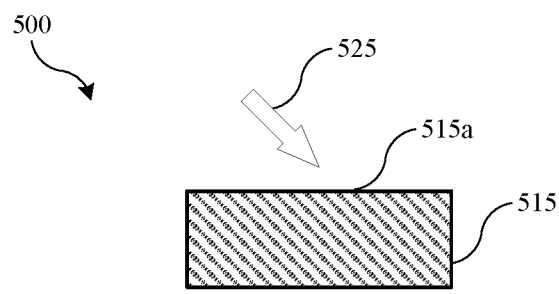
FIGS. 5A-5D show cross-sectional views of substrates configuration being processed according to embodiments of the present technology.

Turning to FIGS. 5A-5D are shown cross-sectional views of structure 500 being processed according to some embodiments of the present technology. The structure may include gallium oxide 515 as shown in FIG. 5A having surface 515a. The gallium oxide 515 may also by overlying gallium nitride or another substrate material that may also include an exposed surface of gallium nitride as previously described. A first reagent 525 is flowed to contact gallium oxide 515. The first reagent 525 may be delivered to the substrate processing region, such as region 110 of FIG. 1, where the reagent may interact with the exposed gallium oxide material 515.

Figure 5B:
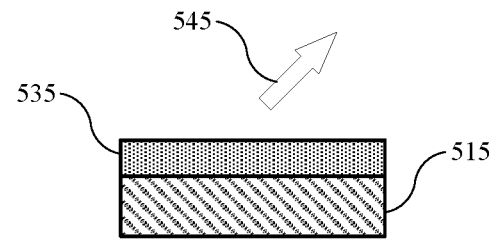
Figure 5C:
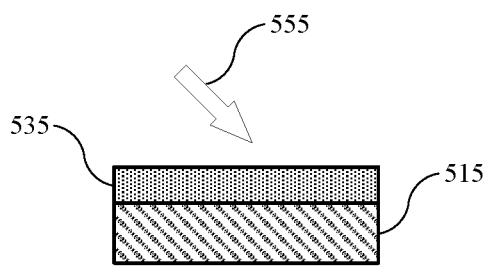
Figure 5D:
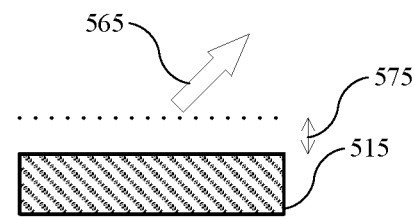

In FIG. 5B is illustrated a structure after methods according to the present technology have begun to be performed, such as discussed with respect to FIG. 4 above. As described above, etching gallium oxide according to embodiments of the present technology may activate the surface 515a of gallium oxide 515 to form products of the reaction with the first reagent in an activated layer 535 of the gallium oxide. Activated layer 535 may include gallium halide and water 545, which may be a vapor and purged from the structure as shown in FIG. 5B. FIG. 5C illustrates a structure wherein the second reagent is introduced to the activated layer 535. The transfer of methyl groups, or other reagent components as noted above, from the second reagent 555 to the gallium halide of activated layer 535 may undergo a ligand exchange to form byproduct 565, which may be $GaY(CH_3)_2$, $Ga(CH_3)_3$, or another byproduct depending on the second reagent, which may also be volatile and be removed to form recessed gallium oxide as in FIG. 5D. The Y may be from the second reagent or the first reagent and may be any of the fluorine, chlorine, or bromine from either reagent, or a combination of materials from each reagent. The etching process of method 400 removes a thickness 575 as shown so that the thickness of gallium oxide 515 is reduced, and which may be any thickness as previously described. Repeated cycles may be performed to achieve desired etch thickness or to remove all of the gallium oxide if desired. By utilizing reagents as discussed throughout the present technology, gallium oxide may be etched from substrates including exposed regions of gallium nitride, for example, while limiting or preventing damage or removal of gallium nitride.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "a precursor" includes reference to one or more precursors and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A method of etching gallium oxide from a semiconductor substrate, the method comprising:
   flowing a reagent in a substrate processing region housing the semiconductor substrate, wherein the reagent comprises at least one of chloride and bromide, wherein the reagent comprises titanium tetrachloride, titanium tetrabromide, silicon tetrachloride, silicon tetrabromide, vanadium(V) chloride, niobium pentachloride, tantalum pentachloride, tungsten(V) chloride, molybdenum (V) chloride, zirconium tetrachloride, molybdenum oxytetrachloride, tungsten(VI) oxytetrachloride, or combinations thereof, and wherein the semiconductor substrate comprises an exposed region of gallium oxide;
   contacting the exposed region of gallium oxide with the at least one of chloride and bromide from the reagent to form a gallium-containing gas;
   halting the flow of the at least one of chloride and bromide from the reagent after a first period of time, wherein the first period of time is less than or about 5 minutes;
   purging the substrate processing region with an inert gas to remove the gallium-containing gas for a second period of time; and
   recessing a surface of the gallium oxide.

2. The method of claim 1, wherein the substrate processing region is maintained plasma free.

3. The method of claim 1, wherein the reagent comprises titanium tetrachloride.

4. The method of claim 1, wherein a temperature in the substrate processing region is maintained between about 150° C. and about 650° C.

5. The method of claim 1, wherein a pressure in the substrate processing region is maintained at less than or about 250 Torr.

6. The method of claim 1, wherein the inert gas comprises nitrogen, helium, argon, or combinations thereof.

7. The method of claim 1, wherein the second period of time is greater than or about 5 seconds.

8. The method of claim 1, wherein a temperature in the substrate processing region is maintained at between about 150° C. and about 650° C.

9. The method of claim 1, wherein the at least one of chloride and bromide from the reagent directly contacts the exposed region of gallium oxide.

10. The method of claim 1, wherein the method is repeated for at least two cycles to achieve a desired etch depth.

11. The method of claim 10, wherein the recessing the surface of the gallium oxide etches a thickness of less than or about 30 A per cycle.

12. The method of claim 1, wherein the exposed region of gallium oxide is overlying gallium nitride.

13. The method of claim 12, wherein an etching selectivity between gallium oxide and gallium nitride is greater than or about 10:1.

* * * * *